(12) United States Patent
Takizawa

(10) Patent No.: US 6,504,254 B2
(45) Date of Patent: Jan. 7, 2003

(54) SEMICONDUCTOR DEVICE WITH DUMMY WIRING LAYERS

(75) Inventor: Jun Takizawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/845,819

(22) Filed: Apr. 30, 2001

(65) Prior Publication Data

US 2002/0043715 A1 Apr. 18, 2002

(30) Foreign Application Priority Data

May 1, 2000 (JP) ........................................ 2000-132353

(51) Int. Cl.[7] .............................................. H01L 23/48
(52) U.S. Cl. ........................ 257/758; 257/773; 257/774
(58) Field of Search ................................. 257/734, 773, 257/774, 758

(56) References Cited

U.S. PATENT DOCUMENTS

| | | | | | |
|---|---|---|---|---|---|
| 4,484,212 | A | * | 11/1984 | Komatsu et al. | 257/758 |
| 5,442,236 | A | * | 8/1995 | Fukawa | 257/758 |
| 5,663,599 | A | * | 9/1997 | Lur | 257/750 |
| 5,763,936 | A | * | 6/1998 | Yamaha et al. | 257/644 |
| 6,118,145 | A | * | 9/2000 | Egawa | 257/296 |
| 6,208,281 | B1 | * | 3/2001 | Jinbo et al. | 341/154 |
| 6,225,697 | B1 | * | 5/2001 | Iguchi | 257/758 |
| 6,261,883 | B1 | * | 7/2001 | Koubuchi et al. | 438/197 |
| 2001/0040242 | A1 | * | 11/2001 | Koike | 257/170 |

* cited by examiner

Primary Examiner—T. N. Quach
(74) Attorney, Agent, or Firm—Harness, Dickey & Pierce, P.L.C.

(57) ABSTRACT

A semiconductor device 100 has wiring layers 20a and 20b and a plurality dummy wiring sections 30 provided at the same level where the wiring layers 20a and 20b are formed. The dummy wiring sections 30 have at least one through hole 32.

35 Claims, 5 Drawing Sheets

SEMICONDUCTOR DEVICE WITH DUMMY WIRING LAYERS

BACKGROUND OF THE INVENTION

1. Field of the Invention

The present invention relates to a semiconductor device, and more particularly to a semiconductor device having a wiring layer.

2. Description of Related Art

Presently, wiring layers are formed in multiple layers in order to accomplish higher integration and further miniaturization of semiconductor devices. Interlayer dielectric layers are formed between wiring layers. The interlayer dielectric layers are planarized by a chemical mechanical polishing method (CMP method).

One technique is proposed to improve planarization of the interlayer dielectric layers by the CMP method. In the technique, as shown in FIG. 5, dummy wiring sections 130 are formed between densely formed metal wiring layers 120a and an isolated metal wiring layer 120b on the same level of the metal wiring layers 120a and 120b in the same step in which the metal wiring layers 120a and 120b are formed.

However, when the dummy wiring sections 130 are formed, the dummy wiring sections 130 overlap device elements (for example, wiring layers 114) that are formed on a level below the dummy wiring sections 130. In this case, when the exterior of the device elements (for example, the wiring layers 114) formed on the level below the dummy wiring sections 130 is inspected, the observation by an optical microscope is difficult.

SUMMARY OF THE INVENTION

It is an object of the present invention to provide a semiconductor device having dummy wiring sections formed therein.

A semiconductor device in accordance with one embodiment of the present invention has a wiring layer and a plurality of dummy wiring sections provided in the same level in which the wiring layer is formed, wherein the dummy wiring sections have at least one through hole.

In accordance with one embodiment of the present invention, at least one of the dummy wiring sections has a through hole. In one embodiment, the dummy wiring sections have a plurality of through holes. As a result, a plan area of the dummy wiring sections that overlap device elements formed on a level below the dummy wiring sections is reduced compared to the case where the dummy wiring sections do not have through holes. As a result, observation of the devices formed on the level below the dummy wiring sections by an optical microscope is facilitated.

In one embodiment, the peripheral section of each of the dummy wiring sections may be continuous.

In accordance with the present invention, the dummy wiring sections can be formed to have any one of the following plan configurations:

(1) The plan configuration of each of the dummy wiring sections may preferably be hexagonal.

When the plan configuration of each of the dummy wiring sections is hexagonal, the dummy wiring sections can be disposed highly densely. Also, when the dielectric layer is polished by the CMP method, the dummy wiring sections are strong against circular movements of the polishing cloth. In other words, the dummy wiring sections can more securely absorb polishing pressures applied in many different directions.

When the plan configuration of each of the dummy wiring sections is hexagonal, the plan configuration of the through hole may be the same as the plan configuration of each of the dummy wiring sections, in other words, may preferably be hexagonal. As a result, an opening area of the through hole at the dummy wiring section can be greater than an opening area provided by any other configurations.

Also, the plan configuration of the through hole may be triangle. As a result, through holes can be formed at locations corresponding to respective sides of the dummy wiring sections.

(2) The plan configuration of each of the dummy wiring sections may preferably be quadrilateral. When the plan configuration of each of the dummy wiring sections is quadrilateral, the configuration of the through hole may preferably be quadrilateral. In this case, because the plan configuration of the through hole is the same as the plan configuration of the dummy wiring section, i.e., quadrilateral, an opening area of the through hole at the dummy wiring section can be greater than an opening area that may be provided by any other configurations.

In one embodiment, the dummy wiring sections may be disposed at specified intervals. Preferably, the dummy wiring sections may be mutually disposed at equal intervals. When the dummy wiring sections are mutually disposed at equal intervals, the polishing pressure can be uniformly distributed over the dummy wiring sections.

The width of the peripheral section of each of the dummy wiring sections is determined in view of patterning accuracy, mechanical strength of the dummy wiring section and the like. For example, the peripheral section of each of the dummy wiring sections may have a width that is the minimum design wiring width (the minimum design rule) or greater but 2 $\mu$m or less. In the case of damascene wirings, when the width of the peripheral section of the dummy wiring section exceeds 2 $\mu$m, the amount of dishing at the dummy wiring section tends to become large.

The dummy wiring sections are formed such that adjacent ones of the dummy wiring sections are in contact with one another.

A semiconductor device in accordance with the present invention is particularly useful when the wiring layer is formed from metal.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

Preferred embodiments of the present invention are described below with reference to the accompanying drawings.

Figure 1:
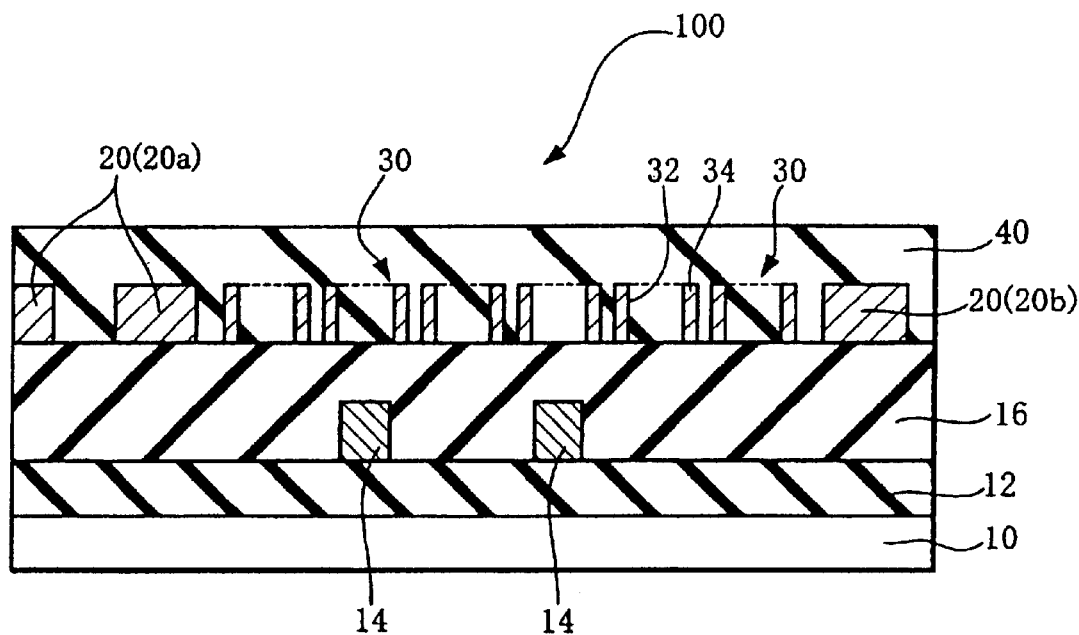
FIG. 1 schematically shows a cross-sectional view of a semiconductor device.

FIG. 1 schematically shows a cross-sectional view of a semiconductor device 100.

The semiconductor device 100 includes a silicon substrate 10. Semiconductor devices (for example, MOSFETs), wiring layers and element isolation regions (not shown) may be formed on a surface of the silicon substrate 10.

A first interlayer dielectric layer 12, a second interlayer dielectric layer 16 and a third interlayer dielectric layer 40 are successively formed over the silicon substrate 10. A first wiring layer 14 is formed between the first interlayer dielectric layer 12 and the second interlayer dielectric layer 16. A second wiring layer 20 is formed between the second interlayer dielectric layer 16 and the third interlayer dielectric layer 40.

The second wiring layer 20 may include mutually densely formed wiring layers 20a and an isolated wiring layer 20b due to the design of the device. A plurality of dummy wiring sections 30 are formed between the mutually densely formed wiring layers 20a and the isolated wiring layer 20b. It is noted that dummy wiring sections may be formed on the level where the first wiring layer 14 is formed.

Figure 2:
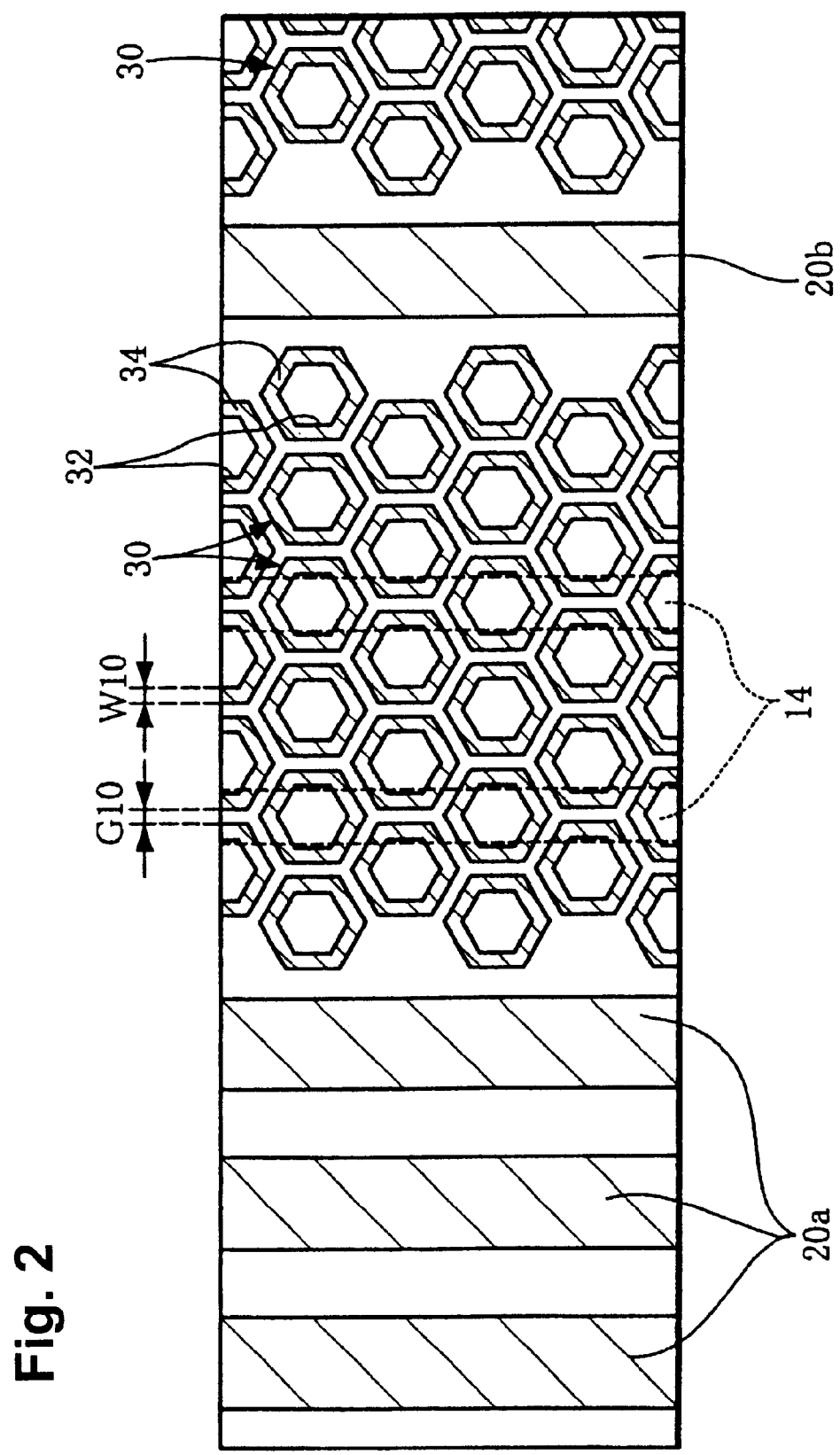
FIG. 2 schematically shows a cross-sectional view of a plane at a level where dummy wiring sections are formed.

A structure of the level where the dummy wiring sections 30 are formed is described below. FIG. 2 schematically shows a cross-sectional view of the level as viewed in plan where the dummy wiring sections 30 are formed.

The dummy wiring sections 30 have through holes 32. Because the dummy wiring sections 30 have the through holes 32, a plan area of the dummy wiring sections 30 that overlap the first wiring layer 14 provided on the level below the dummy wiring sections 30 can be reduced. The through holes 32 can be formed in a manner that a peripheral section 34 of each of the dummy wiring sections 30 is continuous.

The dummy wiring sections 30 are mutually disposed at certain intervals. A separation G10 between the dummy wiring sections 30 may be the minimum design wiring separation or greater but 2 $\mu$m or smaller, more preferably between 1 $\mu$m and 2 $\mu$m. In a preferred embodiment, the dummy wiring sections 30 are mutually formed at equal intervals. As a result, the polishing pressure can be uniformly distributed over the dummy wiring sections 30.

The peripheral section 34 of each of the dummy wiring sections 30 has a width W10. The width W10 of the peripheral section of each of the dummy wiring sections 30 is determined in view of patterning accuracy, mechanical strength of the dummy wiring sections 30 and the like. For example, the peripheral section of each of the dummy wiring sections 30 may have the minimum design wiring width (the minimum design rule) or greater but 2 $\mu$m or smaller, more preferably between 1 $\mu$m and 2 $\mu$m.

Each of the dummy wiring sections 30 may not be limited to a particular plan configuration. For example, each of the dummy wiring sections 30 may preferably have a hexagonal shape, and more preferably have a regular hexagonal shape. When the plan configuration of each of the dummy wiring sections 30 is hexagonal, the dummy wiring sections 30 can be disposed highly densely. Also, when the plan configuration of each of the dummy wiring sections 30 is hexagonal, the dummy wiring sections 30 are strong against circular movements of the polishing cloth, when the dielectric layer is polished by the CMP method. In other words, the dummy wiring sections 30 can more securely absorb polishing pressures applied in many different directions.

Each of the through holes 32 may be any configuration, and may not be limited to a particular plan configuration. For example, when the plan configuration of each of the dummy wiring sections 30 is hexagonal, each of the through holes 32 may preferably have the same plan configuration as that of the dummy wiring section 30, for example, a hexagonal shape, and more preferably a regular hexagonal shape. As a result, the through hole 32 at the dummy wiring section 30 can have an opening area greater than an opening area that may be provided by any other configurations.

Effects provided by the semiconductor device in accordance with the embodiments of the present invention are described below.

In accordance with the embodiments of the present invention, the dummy wiring sections 30 have through holes 32, respectively. As a result, a plan area of the dummy wiring sections 30 that overlaps device elements formed on a level below the dummy wiring sections 30 (for example, the first wiring layers 14) is reduced compared to the case where the dummy wearing sections 30 do not have through holes. As a result, the dummy wiring sections 30 having the through holes 32 facilitate the observation of the device elements formed on the level below the dummy wiring section by an optical microscope.

Figure 3A:
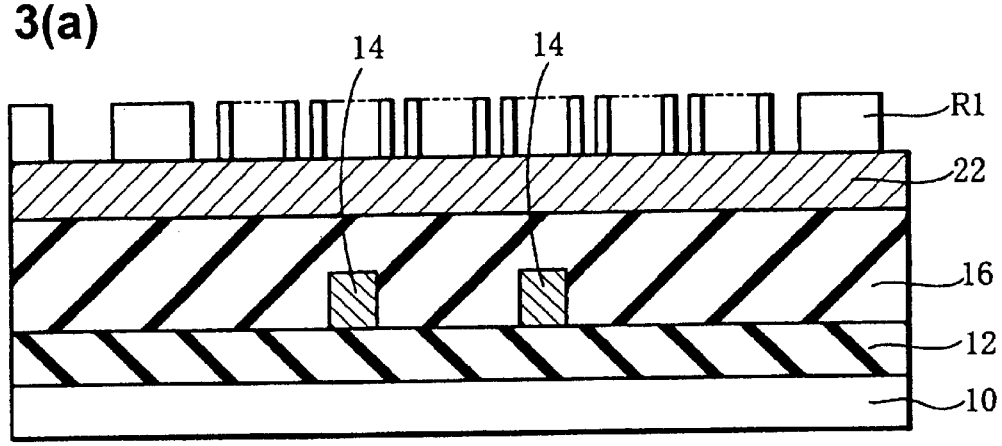
FIGS. 3(a)–3(c) schematically show cross-sectional views of a semiconductor device in a manufacturing process.
Figure 3B:
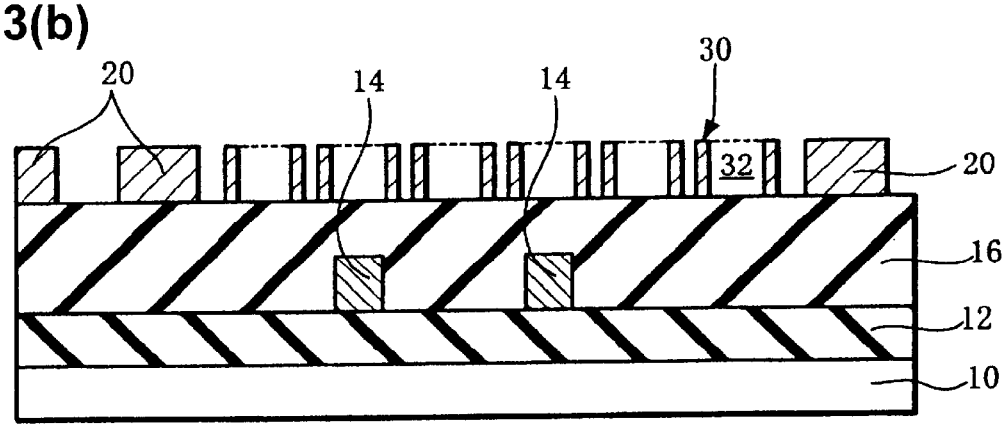
Figure 3C:
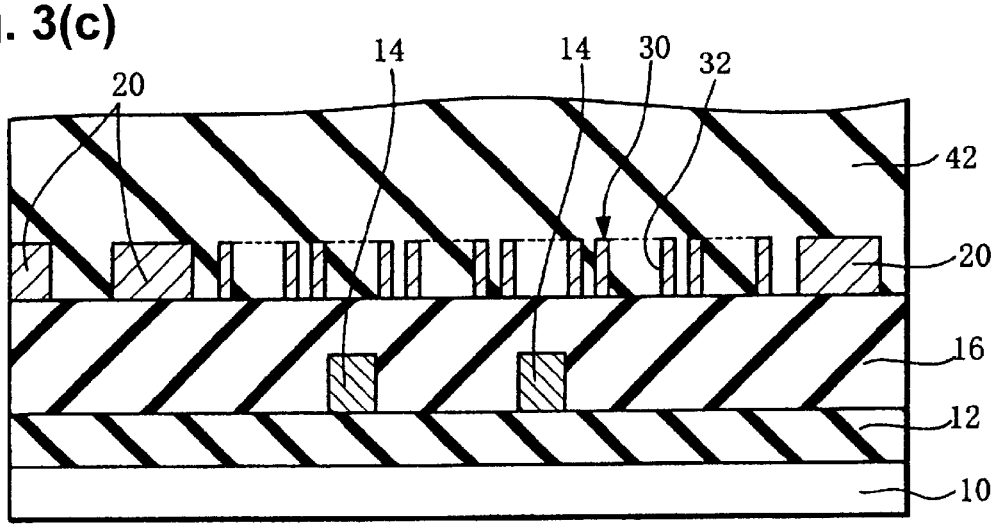

Next, a method for manufacturing a semiconductor device in accordance with one embodiment of the present invention is described below. FIGS. 3(a)–3(c) schematically show cross-sectional views of a semiconductor device in a manufacturing process in accordance with one embodiment of the present invention.

First, referring to FIG. 3(a), semiconductor elements (for example, MOSFETs), wiring layers and element isolation regions (not shown) are formed over a surface of a semiconductor substrate (for example, silicon substrate) 10 by an ordinary method.

Then, a first interlayer dielectric layer 12 is formed over the semiconductor substrate 10 by a known method. Then, contact holes (not shown) are formed in the first interlayer dielectric layer 12. The contact holes are formed by, for example, an anisotropic reactive ion etching. Contact layers (not shown) are formed in the contact holes by a known method. The contact layers are formed from, for example, tungsten plugs, or aluminum alloy layers.

Then, a first wiring layers 14 having a predetermined pattern is formed over the first interlayer dielectric layer 12 by a known method.

Then, a second interlayer dielectric layer 16 is formed over the first interlayer dielectric layer 12 and the first wiring layer 14 by a known method. Then, contact holes are formed in the second interlayer dielectric layer 16, and contact layers (not shown) are formed in the contact holes in a manner similar to the first interlayer dielectric layer 12.

Then, a conduction layer 22 is formed over the second interlayer dielectric layer 16. The conduction layer 22 is not particularly limited to a specific material, however may be formed from an alloy of aluminum and copper, titanium nitride, titanium or the like. The conduction layer 22 may be formed by any method, for example, by a sputtering method. The thickness of the conduction layer 22 may be different depending on the device designs. However, the thickness thereof may be, for example, between 50 nm and 700 nm.

Then, a resist layer R1 having a predetermined pattern is formed over the conduction layer 22. The resist layer R1 masks an area above the region where the second wiring layer 20 is formed and the region where the dummy wiring sections 30 are formed. The resist layer R1 has openings above the regions where the through holes 32 are formed in the dummy wiring sections 30.

Then, as shown in FIG. 3(b), the conduction layer 22 is etched using the resist layer R1 as a mask, to thereby form the second wiring layers 20 and dummy wiring sections 30 having a predetermined pattern. Also in this process, the through holes 32 are formed at the dummy wiring sections 30.

Then, as shown in FIG. 3(c), a dielectric layer 42 is formed over the second interlayer dielectric layer 16, the second wiring layers 20 and the dummy wiring sections 30. The dielectric layer 42 may be formed from any appropriate material, such as, for example, a silicon oxide. When silicon oxide is used as a material of the dielectric layer 42, phosphorus or boron may be contained in the silicon oxide.

The dielectric layer 42 may be formed by, for example, a CVD method or a coating method. The dielectric layer 42 is not limited to a particular film thickness, however, may be between 500 nm and 2000 nm.

Next, the dielectric layer 42 is polished by a CMP method to planarize the dielectric layer 42 to thereby form a third interlayer dielectric layer 40 shown in FIG. 1. The obtained third interlayer dielectric layer 40 has a film thickness, that may be different depending on the device designs, of between 200 nm and 600 nm, for example. In this manner, the semiconductor device 100 is manufactured.

The present invention is not limited to the embodiment described above, and many modifications can be made within the scope of the subject matter of the present invention.

Figure 4A:
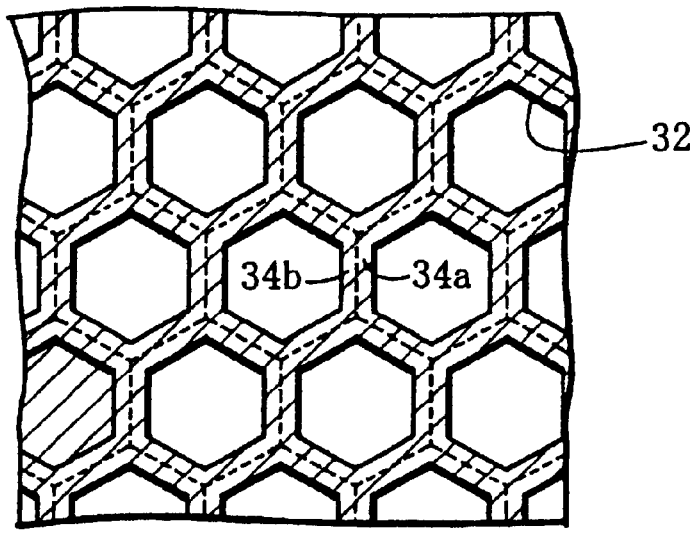
FIGS. 4(a)–4(c) show plan views of a plan configuration of dummy wiring sections and examples of modified plan configurations of through holes.

(1) In the embodiment described above, the dummy wiring sections 30 are formed in the manner that they are spaced from one another by gaps. However, the present invention is not limited to this embodiment. For example, adjacent ones of the dummy wiring sections may be in contact with one another. In one embodiment, the dummy wiring section 30 in plurality may be formed in the form of a honeycomb shape, as shown in FIG. 4(a). More specifically, the dummy wiring sections can be formed in a manner that a peripheral section 34a of a first one of the dummy wiring sections and a peripheral section 34b of a second one of the dummy wiring sections are in contact with one another.

(2) In the embodiment described above, the plan configuration of the through hole 32 is hexagonal. However, the plan configuration of the through hole 32 may be any one of various configurations.

Figure 4B:
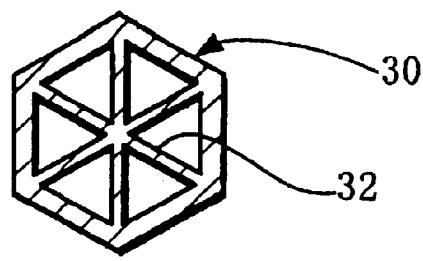

For example, the through hole 32 may be formed in a triangular form, as shown in FIG. 4(b). As a result, the through holes 32 can be formed at positions respectively corresponding to sides of each of the dummy wiring sections 32. Accordingly, the multiple through holes 32 can be densely formed. Also, when a plan configuration of each of the through holes 32 is triangle, diagonally opposing dummy wiring sections 30 connected one another at their apexes can be formed. As a result, the opening area of the dummy wiring sections 30 is prevented from becoming smaller while the strengths of the dummy wiring sections can be improved.

Figure 4C:
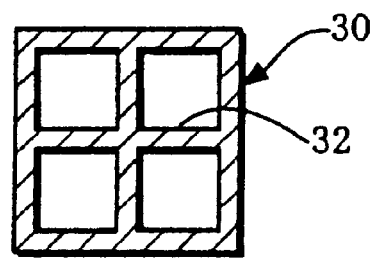
Figure 5:
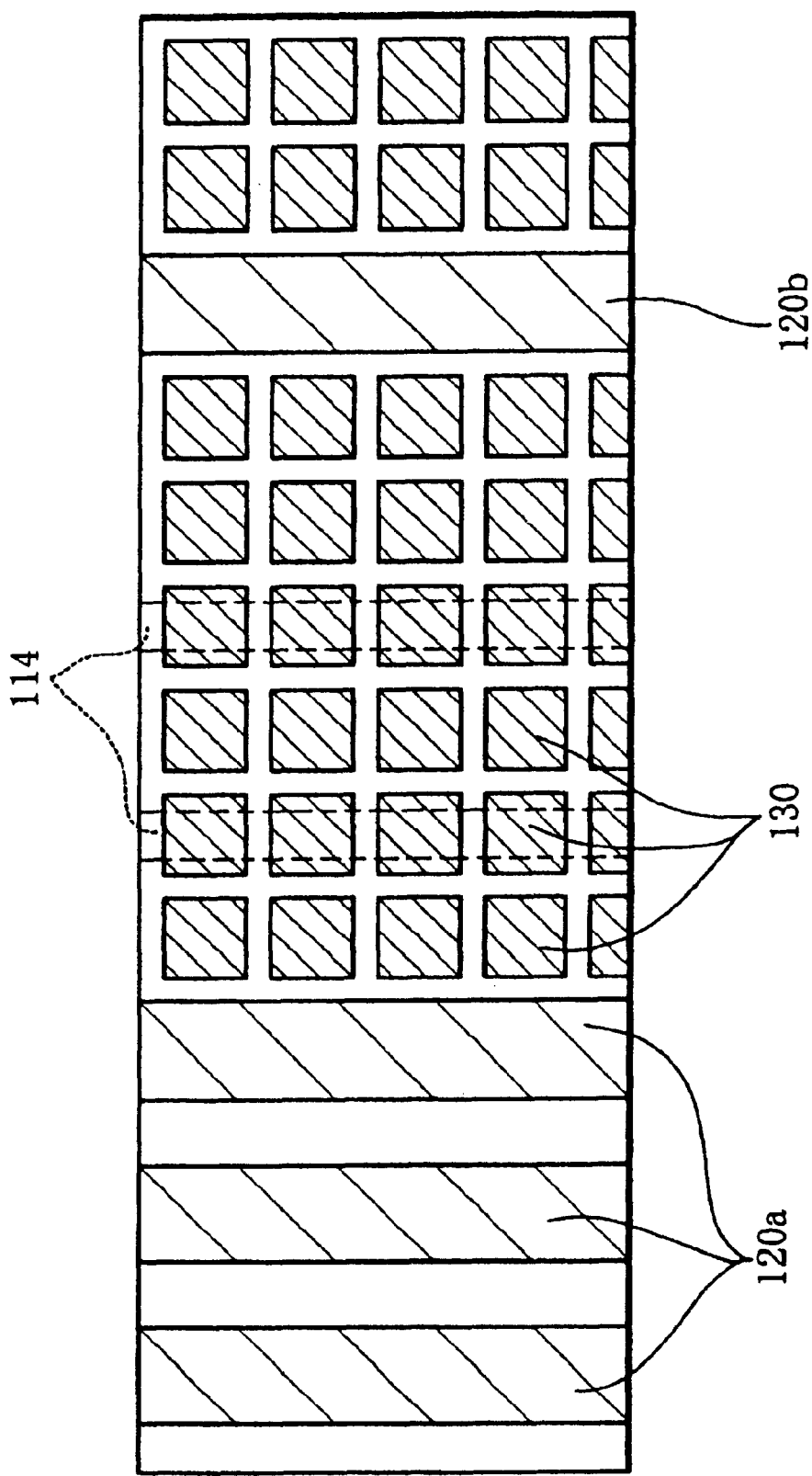
FIG. 5 is an illustration to describe the problems of dummy wiring sections of the conventional structure.

(3) Each of the dummy wiring sections 30 may be formed in the form of a quadrilateral configuration as viewed in plan. When the plan configuration of the dummy wiring section 30 is quadrilateral, the through hole 32 may be formed in a quadrilateral form, as shown in FIG. 4(c). Since the plan configuration of the dummy wiring section 30 is quadrilateral for each of the dummy wiring sections 30 that is also in a quadrilateral configuration as viewed in plan, the through holes 32 in plurality can be more densely formed.

(4) The peripheral section 34 of each of the dummy wiring sections 30 may be continuous. However, the peripheral section 34 of the dummy wiring section 30 may be discontinuous. In other words, the peripheral section 34 of the dummy wiring section 30 may be cut.

(5) In the embodiment described above, the dummy wiring section 30 is formed over the second interlayer dielectric layer 16. However, the present invention is not limited to this particular embodiment. For example, the dummy wiring sections may be formed over an interlayer dielectric layer in the third layer or above.

(6) In the embodiment described above, the second wiring layers 20 are formed, and then the dielectric layer 42 is formed over the second wiring layers 20, and the dielectric layer 42 is polished. However, the second wiring layers 20 and the dummy wiring sections 30 may be formed by the damascene method.

More specifically, the second wiring layers 20 and the dummy wiring layers 30 can be formed in the following manner. A dielectric layer is formed over the second interlayer dielectric layer 16. Opening sections for the second wiring layers 20 and the dummy wiring sections 30 are formed at specified regions of the dielectric layer.

A conduction layer is formed in a manner to fill the openings with the conduction layer. Then, the conduction layer is polished to form the second wiring layers 20 and the dummy wiring sections 30. In this manner, by forming the second wiring layers 20 and the dummy wiring sections 30, the generation of dishing at the isolated second wiring layer 20 can be suppressed. Also, the generation of erosions at the dielectric layer between the densely formed second wiring layers 20a and the isolated second wiring layer 20b can be suppressed. In this case, the width of the dummy wiring section 30 may preferably be 2 μm or less. When the width of the dummy wiring section 30 exceeds 2 μm, the amount of dishing at the dummy wiring sections 30 tends to become greater.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
   a wiring layer;
   a plurality of dummy wiring sections provided in a same level with the wiring layer; and
   at least one device element formed on a layer below the dummy wiring sections;
   wherein the dummy wiring sections have at least one through hole that is aligned substantially above the at least one device element.

2. A semiconductor device according to claim 1, wherein each of the dummy wiring sections has a continuous peripheral section.

3. A semiconductor device according to claim 1, wherein a plan configuration of each of the dummy wiring sections is hexagonal.

4. A semiconductor device according to claim 3, wherein a plan configuration of the through hole is hexagonal.

5. A semiconductor device according to claim 3, wherein a plan configuration of the through hole is triangular.

6. A semiconductor device according to claim 1, wherein a plan configuration of each of the dummy wiring sections is quadrilateral.

7. A semiconductor device according to claim 6, wherein a plan configuration of the through hole is quadrilateral.

8. A semiconductor device according to claim 1, wherein the dummy wiring sections are mutually disposed at predetermined intervals from one another.

9. A semiconductor device according to claim 1, wherein the dummy wiring sections are mutually disposed at equal intervals.

10. A semiconductor device according to claim 1, wherein each of the dummy wiring sections has a peripheral section having a width that is a minimum design wiring width or greater but 2 $\mu$m or less.

11. A semiconductor device according to claim 1, wherein adjacent ones of the dummy wiring sections are in contact with one another.

12. A semiconductor device according to claim 1, wherein the wiring layer is formed from metal.

13. A semiconductor device comprising:
    a first interlayer dielectric layer;
    at least one element formed over the first interlayer dielectric layer;
    a second interlayer dielectric layer formed over the first interlayer dielectric layer and the at least one element; and
    a plurality of dummy wiring sections provided over the second interlayer dielectric layer,
    wherein at least one of the dummy wiring sections has a through hole.

14. A semiconductor device according to claim 13, wherein the through hole extends in a thickness direction of the dummy wiring sections to allow viewing of the at least one element in the thickness direction.

15. A semiconductor device according to claim 13, wherein each of the dummy wiring sections has a continuous peripheral section.

16. A semiconductor device according to claim 13, wherein a plan configuration of each of the dummy wiring sections is substantially identical with a plan configuration of the through hole.

17. A semiconductor device according to claim 13, wherein a plan configuration of each of the dummy wiring sections is hexagonal.

18. A semiconductor device according to claim 17, wherein a plan configuration of the through hole is hexagonal.

19. A semiconductor device according to claim 13, wherein a plan configuration of the through hole is triangular.

20. A semiconductor device according to claim 13, wherein a plan configuration of each of the dummy wiring sections is quadrilateral.

21. A semiconductor device according to claim 20, wherein a plan configuration of the through hole is quadrilateral.

22. A semiconductor device according to claim 13, wherein the dummy wiring sections are mutually spaced a distance from one another.

23. A semiconductor device according to claim 13, wherein the dummy wiring sections are mutually disposed at equal intervals.

24. A semiconductor device according to claim 13, wherein adjacent ones of the dummy wiring sections are in contact with one another.

25. A semiconductor device comprising:
    a substrate;
    a first interlayer dielectric layer disposed over said substrate;
    a first wiring layer disposed over said first interlayer dielectric layer;
    a second interlayer dielectric layer disposed over said first wiring layer;
    a second wiring layer disposed over said second interlayer dielectric layer; and
    a plurality of dummy wiring sections disposed in said wiring layers, wherein said dummy wiring sections contain at least one through hole.

26. A semiconductor device according to claim 25, wherein the dummy wiring sections are hexagonal in shape and said dummy wiring sections are equidistant from each other.

27. A semiconductor device according to claim 26, wherein the through hole is hexagonal in shape.

28. A semiconductor device according to claim 25, wherein the dummy wiring sections are quadrilateral in shape and said dummy wiring sections are equidistant from each other.

29. A semiconductor device according to claim 28, wherein the through hole is quadrilateral in shape.

30. A semiconductor device according to claim 25, wherein the dummy wiring sections contain a plurality of through holes.

31. A semiconductor device according to claim 30, wherein the through holes are triangular in shape.

32. A semiconductor device according to claim 31, wherein said dummy wiring sections are equidistant from each other.

33. A semiconductor device according to claim 30, wherein the through holes are quadrilateral in shape.

34. A semiconductor device according to claim 33, wherein said dummy wiring sections are equidistant from each other.

35. A semiconductor device comprising:
    a wiring layer;
    a plurality of dummy wiring sections provided in a same level with the wiring layer, wherein the dummy wiring sections have at least one through hole; and
    at least one device element formed on a layer below the dummy wiring sections, wherein the through hole is aligned substantially above the at least one device element.

* * * * *

UNITED STATES PATENT AND TRADEMARK OFFICE
CERTIFICATE OF CORRECTION

PATENT NO. : 6,504,254 B2
DATED : January 7, 2003
INVENTOR(S) : Jun Takizawa

It is certified that error appears in the above-identified patent and that said Letters Patent is hereby corrected as shown below:

Column 4,
Line 23, "wearing" should be -- wiring --

Column 8,
Line 49, "claim 33" should be -- claim 32 --

Signed and Sealed this

Twenty-fourth Day of June, 2003

JAMES E. ROGAN
*Director of the United States Patent and Trademark Office*